(12) United States Patent
Rissman

(10) Patent No.: US 6,986,972 B1
(45) Date of Patent: Jan. 17, 2006

(54) ALTERNATING APERTURE PHASE-SHIFT MASK FABRICATION METHOD

(75) Inventor: Paul Rissman, Palo Alto, CA (US)

(73) Assignee: LSI Logic Corporation, Milpitas, CA (US)

(*) Notice: Subject to any disclaimer, the term of this patent is extended or adjusted under 35 U.S.C. 154(b) by 79 days.

(21) Appl. No.: 10/358,968

(22) Filed: Feb. 4, 2003

(51) Int. Cl.
*G01F 9/00* (2006.01)

(52) U.S. Cl. .......................................... 430/5

(58) Field of Classification Search ............ 430/5, 430/322–324, 394
See application file for complete search history.

(56) References Cited

U.S. PATENT DOCUMENTS

| | | | |
|---|---|---|---|
| 5,573,890 A | 11/1996 | Spence | 430/311 |
| 6,228,720 B1 * | 5/2001 | Kitabatake et al. | 438/268 |
| 6,511,777 B1 * | 1/2003 | Pas | 430/5 |
| 6,534,225 B2 * | 3/2003 | Flanders et al. | 430/5 |

OTHER PUBLICATIONS

Levenson et al., "Improving Resolution in Photolithography with a Phase-Shifting Mask", 1982 IEEE, pp. 1828-1836.
Van Der Broeke, Photronics, Inc., "Transferring Phase-Shifting Mask Technology into Mainstream Manufacturing", undated, 5 pages.
Kim et al., "Application of a Multi-Step Quartz Etching Method to Strong PSMs", SPIE vol. 4409 (2001), pp. 118-124.
McCallum et al., International SEMATECH, "Alternating PSM Mask Performance—A Study of Multiple Fabrication Technique Results", undated, 6 pages.
Levenson, "Phase-Shifting Mask Strategies: Isolated Dark Lines", Microlithography World, Mar./Apr. 1992, pp. 6-12.

* cited by examiner

*Primary Examiner*—S. Rosasco
(74) *Attorney, Agent, or Firm*—Beyer Weaver & Thomas, LLP

(57) ABSTRACT

Embodiments of the invention include a method for forming alternating aperture phase-shift masks. An optically transparent substrate suitable for having a pattern of phase-shift regions formed thereon is provided. Alternatively, an opaque pattern is formed on the optically transparent substrate, the opaque pattern defining a pattern of phase-shift regions on the substrate. The phase shift regions are then ion implanted to damage the phase-shift regions. The damage penetrates to a predetermined depth and forms damaged regions that can be more easily etched than the adjacent undamaged portions of the substrate. The damaged portions define a final profile for phase shift recesses to be formed in the substrate. After implantation, substrate material is removed from the damaged phase-shift regions so that recesses are formed therein. The recesses are formed having a depth that corresponds to the depth of the damage caused in the phase-shift regions by the ion implantation.

18 Claims, 4 Drawing Sheets

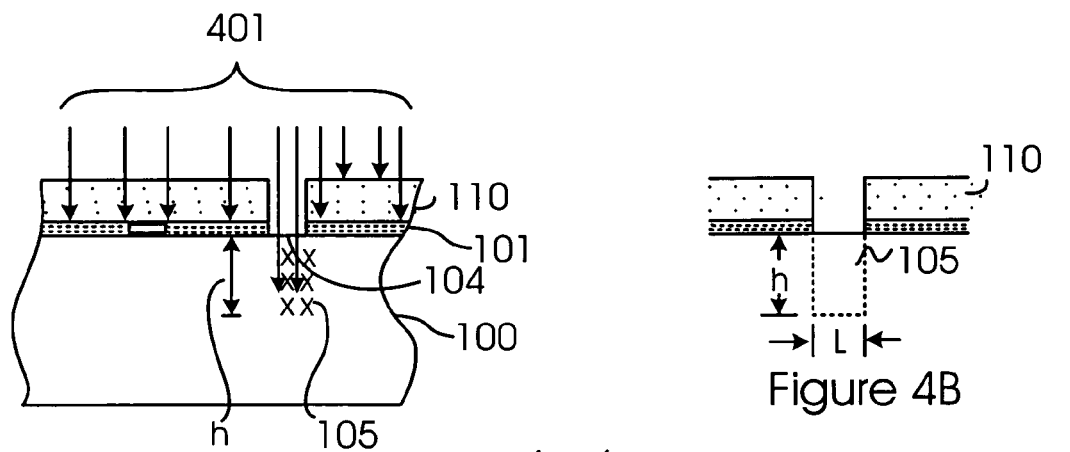
Figure 4A
Figure 4B
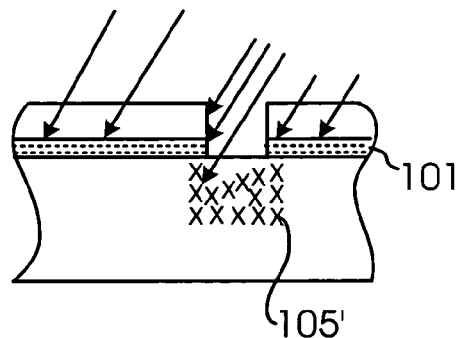
Figure 4C
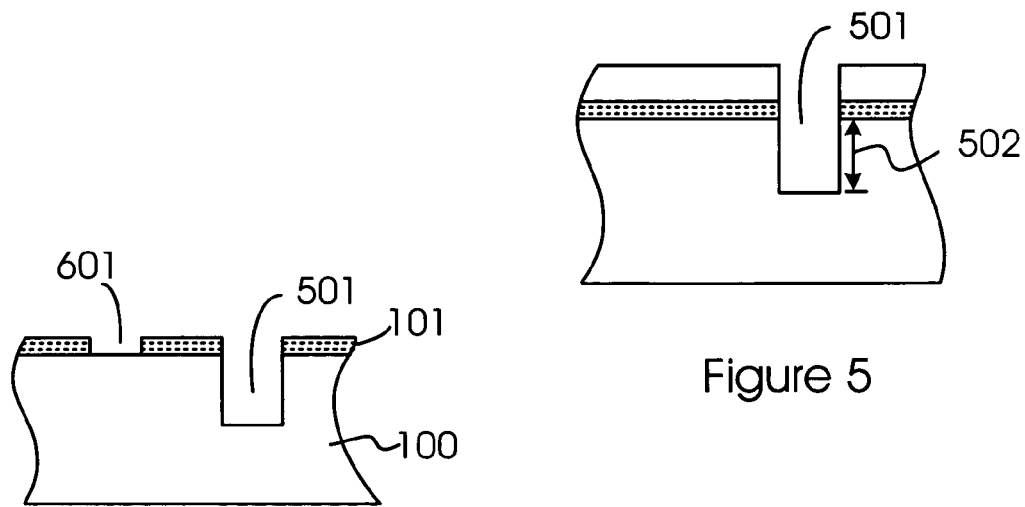
Figure 5
Figure 6

ALTERNATING APERTURE PHASE-SHIFT MASK FABRICATION METHOD

TECHNICAL FIELD

The invention described herein relates generally to semiconductor devices and processing. In particular, the invention relates to alternating aperture phase-shift masks used in making semiconductor products, and more particularly, to methods of making such masks.

BACKGROUND

Conventional optical photolithography is used to fabricate surface structures on semiconductor substrate surfaces. Typically, optical photolithography is achieved by projecting or transmitting light through a pattern made of optically opaque areas and optically clear areas on a mask. The optically opaque areas of the pattern block the light, thereby casting shadows and creating dark areas, while the optically clear areas allow the light to pass, thereby creating light areas. Once the light areas and the dark areas are formed, they are projected onto and through a lens and subsequently onto a substrate.

However, increasing semiconductor device complexity has lead to increased pattern complexity. As a result the pattern packing density on the mask has substantially increased. Additionally, the feature sizes and critical dimensions have steadily decreased, also resulting in denser pattern packing. Consequently, distance between the opaque areas of a mask pattern has decreased. By decreasing the distances between the opaque areas, small apertures are formed which diffract the light that passes through the apertures. Diffraction effects tend to spread or to bend the light as it passes through apertures. This substantially reduces the resolution possible using ordinary masks. This presents an exceptionally severe process limitation for conventional optical photolithography, especially when small features or small geometric patterns are needed.

A number of approaches can be applied to overcome these difficulties. Examples include optical proximity correction (OPC) techniques or the implementation of phase shift masks. This patent concerns phase-shift masks (PSM). A PSM is used in place of conventional masks to image semiconductor surfaces. The operation of a PSM is generally described as follows. In general, light can be thought of as a sinusoidal pattern of light waves that propagate in a medium. "Phase-shifting" describes a change in timing or a shift in the wave form of the regular sinusoidal pattern of light waves. In phase-shift masks, phase-shifting is typically achieved by passing light through areas of a transparent material of either differing thicknesses or through materials with different refractive indexes, thereby changing the phase or the periodic pattern of the light wave. Phase-shift masks reduce diffraction effects by combining diffracted light and phase-shifted light so that constructive and destructive interference takes place. A summation of the constructive and destructive interference results in improved resolution and improved depth of focus.

Two basic types of phase shift patterns can be formed on a mask. One type is an attenuating phase-shift mask. Another type of phase mask is an alternating aperture phase-shift mask (also referred to as a Levenson phase-shift mask). These phase-shift masks are made by a number of conventional methods. An attenuating phase-shift mask typically requires that a layer of opaque material be deposited onto an optically clear plate and then patterned to achieve the required phase-shifting properties. An alternating aperture phase-shift mask (referred to herein as an altPSM or as a Levenson phase-shift mask).

By way of example only, one type of alternating aperture phase-shift mask, as well as a detailed description of theory is disclosed in Marc D. Levenson et al., "Improving Resolution in Photolithography with a Phase-Shifting Mask," I.E.E.E. TRANSACTIONS ON ELECTRON DEVICES, VOL. ED-29, NO. 12, DECEMBER, 1982 which is hereby incorporated herein by reference.

Such alternating aperture phase-shift masks are commonly made by forming an opaque pattern of material on an optically transparent quartz substrate. The opaque pattern of material defines certain prescribed phase-shift regions in the optically transparent quartz substrate. These phase-shift regions (i.e., the optically transparent regions) are then selectively etched to a pre-determined depth. The pre-determined depth is calculated to induce a desired phase shift in the wavelength of light used in a photolithographic process associated with the mask. Thus, typical methods of making alternating aperture phase-shift masks require extraordinary manufacturing precision. First, the phase-shift pattern must be well aligned to the opaque pattern. Even more importantly, the etching process must be extremely well controlled in order to achieve an etch depth into the quartz to very tightly controlled tolerances. Additionally, such etching must be achieved without leaving significant particle residue. Also, in some implementations the phase-shift regions are formed so that they are slightly larger than the opaque material, thereby creating a phase-shift region that slightly undercuts the overlying opaque areas. This undercut is not only difficult to make and to control, but is also susceptible to particle contamination, thereby ruining mask.

Currently used manufacturing techniques have numerous drawbacks that lead to low yields and long manufacturing process times. This results in the extremely high cost of such alternating aperture phase shift masks. For example, in one conventional approach, dry etch techniques are used to remove material from the quartz substrate in the phase-shift regions. However, such dry etch methods frequently have difficulty obtaining the necessary precision in the final etch profile. This is especially so when many phase-shift regions are to be constructed on a single 130 mm by 130 mm mask without the use of etch stops. Moreover, such dry etch techniques frequently leave an unacceptably high amount of residue and other contamination in the mask, thereby ruining the mask. Wet etch techniques are also used to remove material from the quartz substrate in the phase-shift regions. However, wet etching is an even more difficult process to control and frequently fails to obtain the necessary precision in the final etch depth and profile. The problem is so serious that yields on the order of 10% are not uncommon for existing methodologies. The full extent of these problems are described in numerous publications. For example, Van Den Broeke, Douglas et al., "Transferring Phase-Shifting Mask Technology into Mainstream Technology" Semiconductor Fabtech; Edition 5; October 1996; at http://www.semiconductorfabtech.com/journals/edition. 05/index.shtml; which is hereby incorporated herein by reference.

What is needed is a method for fabricating alternating aperture phase-shift masks with a high degree of precision and a relatively high yield.

SUMMARY

In accordance with the principles of the present invention, a method for fabricating various types of alternating aperture phase-shift masks is disclosed.

In a first embodiment, the method involves providing an optically transparent substrate having a pattern of phase-shift regions formed thereon. The substrate is then subject to ion implantation of the phase-shift regions. The ion implantation damages the phase-shift regions to a predetermined depth thereby forming damaged regions that can be more easily etched than the adjacent undamaged portions of the substrate. These damaged portions can be used to define a final profile for phase-shift recesses formed in the substrate. After implantation, substrate material is removed from the damaged phase-shift regions so that phase-shifting recesses are formed therein. The recesses are formed having a depth that corresponds to the depth of the damage caused in the phase-shift regions by the ion implantation.

In another embodiment, the method involves providing an optically transparent substrate with an opaque pattern formed thereon, the opaque pattern defining a pattern of phase-shift regions in the optically transparent substrate. The substrate is then subject to ion implantation of the phase-shift regions. The ion implantation damages the phase-shift regions to a predetermined depth thereby forming damaged regions that are more easily etched than the adjacent undamaged portions of the substrate. These damaged portions can be used to define a final profile for phase-shift recesses formed in the substrate. After implantation, substrate material is removed from the damaged phase-shift regions so that recesses are formed therein. The recesses are formed having a depth that corresponds to the depth of the damage caused in the phase-shift regions by the ion implantation.

Embodiments of the invention also include alternating aperture phase-shift masks constructed in accordance with the above-described methodologies.

These and other aspects of the present invention are described in the detailed description of the embodiments set forth hereinbelow.

BRIEF DESCRIPTION OF THE DRAWINGS

The following detailed description can be more readily understood in conjunction with the accompanying drawings, in which:

FIGS. 1–6 are simplified schematic cross-sectional views that depict a method embodiment used to fabricate a phase-shift mask in accordance with the principles of the present invention. In particular, the figures depict of a portion of an optically transparent substrate having a phase-shift fabrication processes performed thereon in accordance with the principles of the invention.

FIG. 1 is a simplified schematic cross-sectional view of a portion of an optically transparent substrate surface in readiness for phase-shift mask fabrication in accordance with the principles of the invention.

FIG. 2 depicts the surface of FIG. 1 after a first patterning step that forms a pattern in the optically opaque layer formed on the optically transparent substrate.

FIG. 3 depicts the surface of FIG. 2 after portions of the patterned optically opaque layer are pattern masked.

FIGS. 4A and 4B depict the formation of damaged phase-shift regions on the surface of FIG. 3 during ion implantation processes of the present invention.

FIG. 4C depicts the surface of FIG. 3 as an angled ion implantation process is used to damage selected phase-shift regions and establish undercut regions in accordance with the principles of the invention.

FIG. 5 depicts the surface of FIG. 4A during a post implantation etching process is used remove damaged material from phase-shift regions in accordance with the principles of the invention.

FIG. 6 depicts the surface of FIG. 5 after the photoresist layer is removed completing a phase-shift mask embodiment in accordance with the principles of the invention.

It is to be understood that, in the drawings, like reference numerals designate like structural elements. Also, it is understood that the depictions in the Figures are not necessarily to scale.

DETAILED DESCRIPTION OF THE DRAWINGS

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of phase-shaft mask fabrication methodologies and associated methods of forming recesses in a substrate to very high degrees of precision. Conventional approaches to fabricating alternating aperture phase-shift masks have experienced serious difficulties in creating the necessary phase-shift recesses in the mask substrate. Chief among these difficulties is the difficulty in maintaining depth control in the phase-shift recesses. Additionally, there are contamination difficulties related to conventional fabrication processes. Failure to maintain adequate depth control or prevent excessive incidence of contamination both result in mask failure. The present invention includes embodiments that provide a high degree of depth control and a lowered incidence of contamination.

The principles of the present invention take advantage of the highly controllable nature of ion implantation processes to precisely define the dimensions of phase-shift recesses. Additionally, embodiments of the invention take advantage of the fact that damage caused by ion implantation results in differing etchability between damaged and undamaged materials to achieve phase-shift recesses having precisely controlled dimensions (e.g., depth). These and other principles of the invention will be explained hereinbelow.

Figure 1:
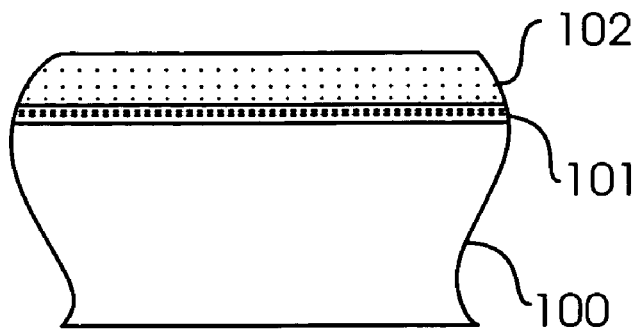

FIG. 1 depicts a basic starting structure for the construction of an alternating aperture phase-shift mask. An optically transparent substrate 100 is provided. The substrate 100 material should be optically transmissive in the wavelength of light used in an associated lithography process. Thus, if the substrate 100 is to be used to form a mask to be used in 157 nm lithography processes, the substrate 100 should be transmissive to light having a wavelength of 157 nm. If the substrate 100 is to be used to form a mask to be used in 193 nm lithography processes, the substrate 100 should be transmissive to light having a wavelength of 193 nm, and so on. Additionally, other particularly attractive exposure wavelengths include, but are specifically not limited to, 248 nm and 365 nm. Although any suitable optically transmissive material can be used for the substrate 100, quartz is the preferred material. A layer of optically opaque material 101 is then formed over the substrate 100. Typically, the opaque material 101 is chromium. However, any optically opaque material can be used. The layer of optically opaque material 101 is overlaid with a layer of resist material 102. One suitable class of such resist materials includes, but is not limited to photoresist materials. Also, electron sensitive resist materials can be used. All of the elements so far discussed, an optically transparent substrate 100, optically opaque materials 101, and resist materials 102 are well known and readily available from a number of different manufacturers known to persons having ordinary skill in the art. The forgoing multi-layer structure is suitable for further fabrication. The inventors contemplate that the principles of the invention can be applied to substrates that do not include a pattern of optically opaque material formed thereon. Such implementations will be discussed below.

Figure 2:
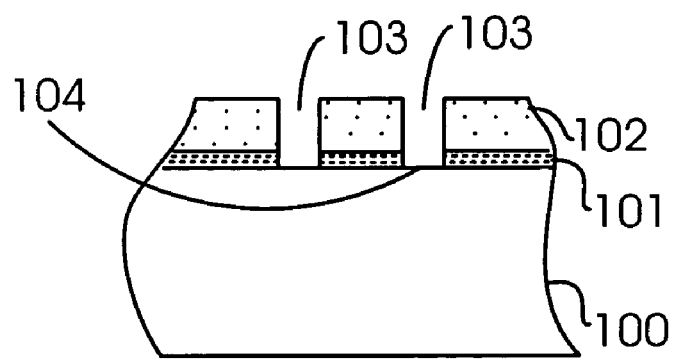

FIG. 2 depicts the substrate of FIG. 1 after processing in accordance with the principles of the invention. This can be achieved using a number of methodologies known to those of ordinary skill. The pattern is formed using any of a number of processes known to persons having ordinary skill in the art. For example, optical pattern writers or e-beam machines can be used. One implementation will be generally described as follows. This step is referred to as a first patterning step. The resist material 102 is exposed in accordance with a predetermined pattern. After the resist material 102 is developed, openings 103 are formed in the resist material exposing the underlying layer of optically opaque material 101. The exposed layer of optically opaque material 101 is etched to expose the underlying optically transmissive substrate 100. The opening 103 defines a portion of the optically transmissive substrate 100 called a phase-shift aperture 104. The phase-shift aperture 104 defines a portion of the substrate 100 where phase-shifting features are to be formed. At this point, phase-shifting features can be formed in accordance with principles explained herein below. However, in most masks ordinary apertures and phase-shift apertures are required on the same mask. So a slightly different process is required.

Figure 3:
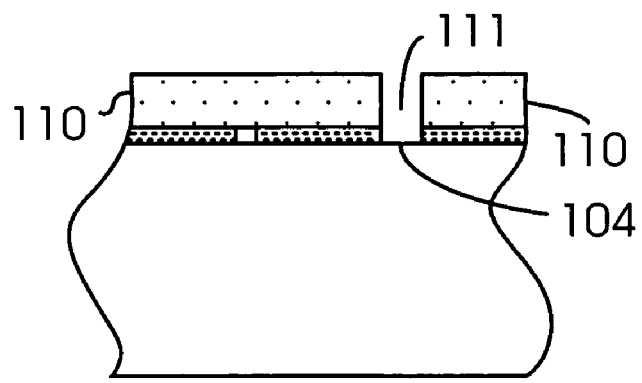

FIG. 3 depicts another aspect of the subject embodiment. A second patterning is conducted. The existing layer of resist material 102 is removed. Another layer of resist material 110 is formed, exposed, and developed so that an opening 111 exposes the phase-shift aperture 104.

Up to this point the process is relatively similar to conventional techniques for achieving alternating aperture phase-shift mask as known to those having ordinary skill in the art. However, at this point the disclosed principles of the invention diverge markedly from conventional processes. As previously indicated, conventional techniques are unable to consistently form phase-shift recesses having acceptable depth control. This is critical because even small variations in the depth of the phase-shift recess renders the phase-shifting properties of the recess inoperative. Ion implantation, as used herein refers to conventional ion implantation as well as plasma implantation techniques. Ion implantation is a highly controllable process having well defined and characterized properties. One of the properties of ion implantation is its ability to damage the structure of materials implanted. In many applications, this property is extremely undesirable. Such damage alters many of the properties of the damaged material. However, in the present invention the inventor has put this property to extremely advantageous use.

One well studied property of ion implantation techniques is the depth to which implanted ions penetrate into the implantation target. This property is dependent primarily on the implantation voltage used to conduct the implantation. However, other factors include, but are not limited to, the type of ion species implanted, the composition of the implantation target, and a number of other factors. As stated previously the depth to which ions can be implanted can be highly controlled. Ion implantation can be used to control the implantation depth to within ±1 or 2% of the desired depth. Tolerances of ±25 Å are easily achievable. Additionally, material damaged by implantation is significantly more easily etched than the same material not damaged. Thus, during etching a damaged portion can be easily etched whereas an adjacent undamaged portion will be easily remove creating a sharply delineated profile at the interface between the damaged and undamaged regions. One embodiment of how such principles can be used to form phase-shift masks in accordance with the principles of the invention is illustrated with respect to FIGS. 4–6.

FIG. 4A depicts the substrate shown in FIG. 3 being subjected to ion implantation to damage the phase-shift region 105 (schematically depicted by the X's) in the phase-shift aperture 104. The depicted ions 401 (schematically depicted by the arrows) are directed onto the patterned and masked substrate 100. The layer of opaque material 101 and the layer of resist material 110 protect the underlying substrate 100 from implantation. However, the exposed phase-shift aperture 104 is unprotected. As a result the ions penetrate into the exposed portion of the substrate 100 to cause damage in the phase-shift region 105. FIG. 4B is a close-up view of the damaged region phase-shift region 105 of the substrate. The openings in the resist material 110 define the lateral dimensions L of the damaged phase-shift region 105. The parameters of the implantation process are used to control the depth to which the ions penetrate into the substrate 100. As a result, the ions controllably penetrate into the substrate 100 a specified depth h to damage the phase-shift region 105. This depth h is determined by the implantation energy and type of ion used to achieve the implantation as well as other factors known to persons having ordinary skill in the art. The depth h of implantation is set at a predetermined level that depends on the desired final depth for the phase-shift region. For example, if a phase-shift of 180° (degrees) is desired, the predetermined depth h can calculated using the following relationship:

$$h = \frac{\lambda}{2(n_q - n_a)}; \quad \text{[Eqn. 1]}$$

wherein h refers to the predetermined depth (in nanometers (nm)) sufficient to induce a 180 degree (°) phase shift in a phase shift region;

wherein λ refers to the wavelength of light (in nm) to be used with the alternating aperture phase-shift mask;

wherein $n_q$ refers to the refractive index of quartz (1.51); and wherein $n_a$ refers to the refractive index of air (1.00).

As is known to those having ordinary skill in the art, the values for the relevant refractive indexes vary in accordance with the different materials for the mask substrate and the ambient medium in which the mask is used.

A variety of different materials can be used for implantation. Examples include but are not limited to nitrogen, argon, oxygen, neon, xenon, and other inert materials. In a preferred embodiment, nitrogen ions are used as the implantation material. Nitrogen is useful because it retards oxidation formation and its silicon implantation properties are well understood. Using nitrogen, typically a dose of between about $1 \times 10^{13}$ ions/cm$^2$ to about $1 \times 10^{15}$ ions/cm$^2$ is satisfactory. In one preferred implementation, nitrogen can be implanted using a dose of about $3.5 \times 10^{14}$ ions/cm$^2$. As is known to those having ordinary skill in the art, doses for other implantation materials can be varied.

The implantation voltage is selected to obtain the desired implantation depth. Higher implantation voltages obtain deeper implantation depths. Using nitrogen ions to implant a quartz substrate, the relationship of an implantation depth d to implantation voltage can be described by the following empirically determined relationship:

$$d = 3.29 \cdot V + 11.45 \quad \text{[Eqn. 2]}$$

wherein d refers to a desired implantation depth (in nm); and wherein V refers to implantation voltage in kiloelectron volts (keV).

For example, if a 193 nm light source is to be used with mask of the present invention, and a 180° phase shift is desired, the predetermined implantation depth h can be calculated using Eqn. 1 as follows:

$$h = \frac{193 \text{ nm}}{2 \cdot (1.51 - 1.00)} = 189 \text{ nm};$$

Additionally, using Eqn. 2 the implantation voltage required to obtain the required implantation depth for nitrogen ions into a quartz substrate is calculated as follows:

$$(189 - 11.45)/3.29 = 54 \text{ keV}$$

Similarly, for a lithography wavelength of 157 nm about 43 keV should be used, for a wavelength of 248 nm about 70 keV should be used, and so on.

The implantation damages a portion of the substrate (i.e. the phase-shift region 105) that corresponds to the final dimensions of a desired phase-shift recess to be formed in the substrate 100.

The importance of the implantation step is that it creates a damaged phase-shift region 105 that is significantly more susceptible to etching than the adjacent undamaged substrate material. Thus, the damaged region (which corresponds to dimensions of a desired phase-shift recess) can be easily removed through etching whereas the surrounding undamaged material is removed more slowly using the same etch process. In effect, the undamaged portion of the substrate operates much like an etch stop. The real advantage of such a process is that the damage caused by ion implantation can be extremely well controlled in a way that etch processes can not. Thus, the precision dimensions and depth of the phase-shift region can be established using ion implantation rather the comparatively clumsy process of etching. For example, by using a nitrogen implantation dose of about $3.5 \times 10^{14}$ ions/cm$^2$ the etch rate for a damaged quartz substrate is about 4.5 times greater than for the undamaged quartz substrate. The effect of this etch rate differential will be explained herein below.

FIG. 4C depicts an approach for generating a phase-shift recess that undercuts the optically opaque pattern formed on the surface. FIG. 4A shows and implantation performed substantially perpendicular the substrate surface. Reference to FIG. 4C shows that by using an implantation angle, the implantation damage can be extended underneath the overlying layer of optically opaque materials 101. In subsequent etching processes the damaged substrate can be removed from underneath portions of the optically opaque materials 101 to form an undercut phase-shift recess (identified here by the damaged phase-shift region 105' (depicted with X's)).

FIG. 5 depicts the substrate of FIG. 4A after removal of the damaged material from the phase shift region. The resulting structure includes a precisely dimensioned phase-shift recess 501 having a precisely controlled depth 502. Typically, such removal is accomplished using etch techniques (e.g., dry etching and wet etching). Because the damaged material in the phase-shift region (e.g., 105 of FIG. 4A) is so much easier to etch than the surrounding undamaged material, the interface between the damaged and undamaged portions of the substrate operates as a precisely formed etch stop that defines the final dimensions for a phase-shift recess 501. For example, by using a dose of about $3.5 \times 10^{14}$ nitrogen ions/cm$^2$, an etch rate differential between damaged and undamaged quartz of about 4.5 can be achieved. Thus, using a standard wet etch bath with HF (hydrofluoric acid) in deionized water (DI) an excellent etch profile having good depth control can be used. In one implementation an etch bath using a 30:1 DI:HF etchant can be used to achieve satisfactory results. As is known to those having ordinary skill in the art, other dilutions of DI:HF can be used. Also, other etchants can be used. Wet etch techniques are preferred because, used properly, they can reduce the amount of particles and can also remove (clean away) particles from the mask. However, the inventor contemplates that dry etch techniques (e.g., plasma etching, reactive ion etching, magnetically enhanced reactive ion etch, inductively coupled plasma etching, electron spin resonance etching as well other related dry etch techniques) can be used to achieve satisfactory results in accordance with the principles of the invention.

FIG. 6 shows the substrate of FIG. 5 after the etching is complete and the layer of resist material is removed. The substrate 100 includes an optically opaque pattern (101) formed thereon. The optically opaque pattern can include both standard photolithographic apertures 601 defined by the optically opaque pattern and phase-shift recesses 501 having the desired dimensions and a highly precise depth. Such a structure comprises one embodiment of an alternating aperture phase-shift mask in accordance with the principles of the invention. The inventor contemplates that phase shift recesses can be formed to induce other than 180° phase shifts. For example, phase-shift masks can be constructed to achieve phases shifts of 0°, 60°, 120°, and 180° to avoid printing undesired features. An example of one such implementation is described in the U.S. Pat. No. 5,573,890, by Spence, entitled "Method of Optical Lithography Using Phase Shift Masking", filed on Jul. 18, 1994 which is hereby incorporate by reference.

FIGS. 7–10 describe a slightly different, but related embodiment used to form alternating aperture phase-shift mask without an opaque pattern formed on the surface of the optically transparent substrate. Such masks are generally referred to as "chromeless" masks.

Figure 7:
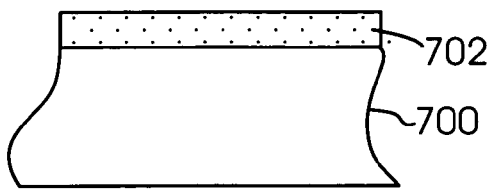
FIG. 7 is a simplified schematic cross-sectional view of a portion of an optically transparent substrate surface in readiness for fabrication of a "chromeless" phase-shift mask in accordance with the principles of the invention.

FIG. 7 depicts a basic starting structure for the construction of another embodiment of an alternating aperture phase-shift mask. An optically transparent substrate 700 is provided. As before, the substrate 700 material should be optically transmissive in the wavelength of light used in an associated lithography process. As before, quartz is the preferred material although other suitable materials can be used. Unlike the prior embodiment, the depicted portion of the mask does not include a pattern of optically opaque material. As previously indicated, this type of alternating aperture phase-shift mask is sometimes referred to as a "chromeless" mask.

The substrate 700 is overlaid with a layer of resist material 702 such as described previously. A previously indicated, the optically transparent substrate 700, and resist materials 702 are well known and readily available from a number of different manufacturers known to persons having ordinary skill in the art. The forgoing multi-layer structure is suitable for further fabrication.

Figure 8:
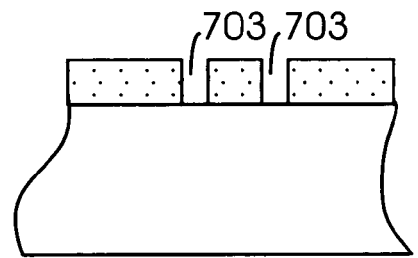
FIG. 8 depicts the surface of FIG. 7 after a patterning step that forms a pattern in photomask layer formed on the optically transparent substrate.

FIG. 8 depicts the substrate of FIG. 7 after a pattern is formed in the layer of resist material 702. As before, this can be achieved using conventional processes. For example, the resist material 702 is exposed and photo-lithographically patterned and then developed in accordance with a predetermined pattern to form a pattern of openings 703 in the resist material exposing the underlying optically transmissive substrate 700. As before the openings 703 define the phase-shift apertures. At this point, phase-shifting features can be formed in accordance with principles explained herein above.

Figure 9:
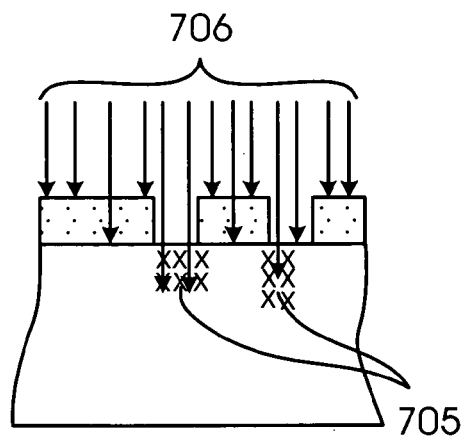
FIG. 9 depicts the surface of FIG. 7 during ion implantation processes used to damage selected phase-shift regions in accordance with the principles of the invention.

FIG. 9 depicts the implantation of the substrate 700 to damage the phase-shift regions 705 (schematically depicted by the X's) in the phase-shift aperture 104. The depicted ions 706 are directed onto the patterned and masked substrate 700. The layer of resist material 702 protects the covered portions of the substrate 700 from implantation. The ions 706 penetrate into the phase-shift regions 705. As before the lateral dimensions and the depth of the phase-shift regions 705 are well defined by the implantation processes. As before, many different implantation ions can be used and the implantation energy is adjusted so that the ions damage the substrate to the desired depth. Also as indicated ion implantation with nitrogen at a dose of about $3.5 \times 10^{14}$ ions/cm$^2$ is preferred. The implantation voltage is adjusted to achieve the desired depth. Also, as described herein above, many different materials can be used as implantation materials and many different dose levels can be used.

Figure 10:
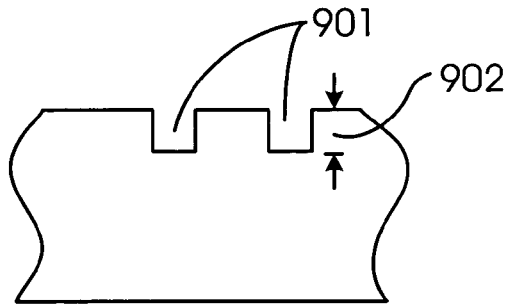
FIG. 10 depicts the surface of FIG. 9 after a post implantation etching and after the photomask is removed from the substrate completing a phase-shift mask in accordance with the principles of the invention.

FIG. 10 depicts the substrate of FIG. 9 after an etch process is used to remove the damaged material from the phase shift regions and the resist material is removed. The resulting structure includes a pattern of precisely dimensioned phase-shift recesses 901, each having a precisely controlled depth 902. As before, a standard wet etch or dry etch can be used to remove the damaged material from the phase-shift regions. Also, as before a wet etch is preferred. The phase-shift pattern can be included in an alternating aperture phase-shift mask that includes standard photolithographic apertures defined by the optically opaque pattern and phase-shift recesses defined by an optically opaque pattern. Such a structure comprises one embodiment of an alternating aperture phase-shift mask in accordance with the principles of the invention.

Figure 11:
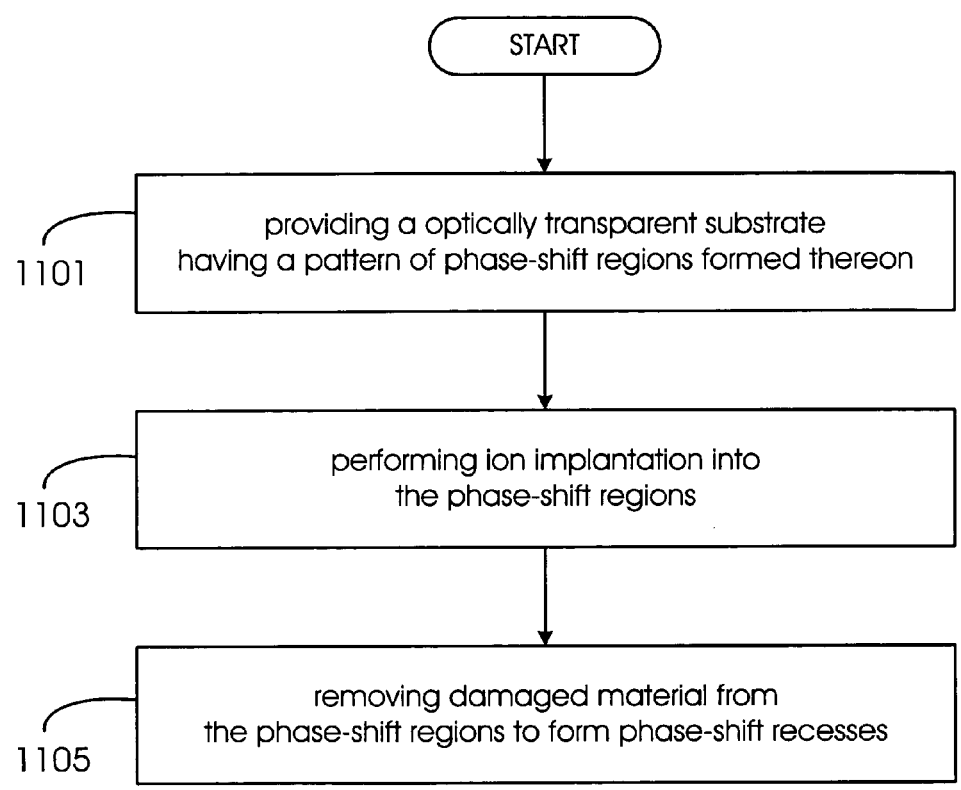
FIG. 11 is a flow diagram illustrating one embodiment of a process for forming gate oxide layers in accordance with the principles of the present invention.

FIG. 11 is a flow diagram that describes a method embodiment for forming an alternating aperture phase-shift mask in accordance with the principles of the invention. The method includes providing an optically transparent substrate suitable for having a pattern of phase-shift regions formed thereon (Step 1101). Such substrates are well described herein above. In some embodiments, the are used for "chromeless" masks which do not have a pattern of optically opaque material thereon. These masks simply feature a pattern of resist material that defines a pattern of phase-shift apertures thereon. Other substrates comprise an optically transparent substrate having an opaque pattern formed thereon, the opaque pattern defining the pattern of phase-shift regions of the semiconductor substrate. This opaque pattern has an accompanying pattern of resist material formed thereon, such that a pattern of phase-shift apertures thereon. Such substrates can be formed using a number of process methodologies known in the art.

The substrate is then subjected to ion implantation into the phase-shift regions (Step 1103). This process is well described herein above. The implantation process is intended to damage the substrate in the phase-shift regions, the damage penetrating to a predetermined depth into the substrate to form the damaged phase-shift regions. The substrate material is then removed from the damaged phase-shift regions to form phase shift recesses in the phase shift regions (Step 1105). The recesses are formed having a precisely controlled predetermined depth suitable for forming an alternating aperture phase-shift mask. These and many other processing steps can be implemented using substrates subjected to processing in accordance with the principles of the present invention.

In another implementation, the implantation step can be accomplished by implanting the quartz substrate (blank) prior to the patterning of the quartz substrate with opaque material. Or in "chromeless" embodiments, where there is no pattern of opaque material, the implantation step can be accomplished prior to defining the pattern of phase-shift regions and recesses. This can easily be accomplished by a mask manufacturer prior to delivery to an end user that will form the appropriate mask patterns in the blank substrate. The blank is fabricated and then implanted to the desired depth. In some embodiments, an opaque layer is then formed on the implanted blank. A resist material is then formed over the opaque layer. The opaque layer is patterned (defining phase shift regions) and then the phase shift regions are etched to form the appropriate phase shift openings. In a chromeless mask embodiment, the blank is fabricated and then implanted to the desired depth. A resist material is then formed and lithographically patterned over the blank. A patterned resist layer defines the phase shift regions. The phase shift regions are etched to form the appropriate phase shift openings.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. In particular, it is contemplated that ion implantation steps used on the phase-shift regions of the substrate can be accomplished using a wide range of implantation parameters including, but not limited to implantation material, doses, and implantation energies to accomplish the principles of the present invention. Further, reference in the claims to an element in the singular is not intended to mean "one and only one" unless explicitly stated, but rather, "at least one". Furthermore, the embodiments illustratively disclosed herein can be practiced without any element which is not specifically disclosed herein.

We claim:

1. A method for fabricating an alternating aperture phase-shift mask, the method comprising:
providing a optically transparent substrate having an opaque pattern formed thereon, the opaque pattern defining a pattern of phase-shift regions on the substrate;
damaging the phase-shift regions of the substrate by implanting ions into the phase-shift regions of the substrate to a selected implantation depth, the damaged material of the phase-shift regions being more easily etched than undamaged portions of the substrate the ion implantation further comprising implanting ions into the phase-shift regions of the substrate at an angle so that the damaged material in the phase-shift region undercuts portions of the opaque pattern; and
removing damaged material from the phase-shift regions to a predetermined depth associated with the selected implantation depth, thereby forming phase-shift recesses having the predetermined depth in the phase-shift regions thereby forming an alternating aperture phase-shift mask.

2. The method of claim 1, wherein removing the damaged material from the phase-shift regions comprises dry etching the phase-shift regions for a period of time sufficient to form a recess in the phase-shift regions of the substrate, the recess having the predetermined depth.

3. The method of claim 2, wherein the dry etching comprises a dry etch process selected from among plasma etching, reactive ion etching, magnetically enhanced reactive ion etch, inductively coupled plasma etching, electron spin resonance etching.

4. The method of claim 1, wherein removing the damaged material from the phase-shift regions comprises wet etching the phase-shift regions for a period of time sufficient to form a recess in the phase-shift regions of the substrate, the recess having the predetermined depth.

5. The method of claim 1, wherein the ion implantation of the substrate comprises implanting the substrate with ions having an implantation energy sufficient to damage the substrate to the predetermined depth and wherein the predetermined depth comprises a depth sufficient such that recesses formed induce a 180 degree (°) phase shift in light passing through the mask.

6. The method of claim 1, wherein performing the ion implantation of the substrate comprises implanting the substrate with ions having an implantation energy sufficient to damage the substrate to the predetermined depth and wherein the predetermined depth comprises a depth sufficient such that the recesses formed, induce 0 degree (°), 60°, 120°, and 180° phase shifts in light passing through the mask.

7. The method of claim 1, wherein performing the ion implantation of the substrate comprises implanting the substrate with ions having an implantation energy sufficient to damage the substrate to the predetermined depth and wherein the predetermined depth comprises a depth sufficient such that the recesses formed, induce other than a 180° phase shift in light passing through the mask.

8. The method of claim 1, wherein performing the ion implantation comprises implanting ions into the phase-shift regions of the substrate using an implantation energy that is adjusted depending on a desired depth of an intended phase-shift recess to be formed in the phase-shift region.

9. The method of claim 1, wherein performing the ion implantation comprises implanting ions into the phase-shift regions of the substrate using an implantation energy that is adjusted depending on a desired depth of an intended phase-shift recess to be formed in the phase-shift region and the choice of implantation ion.

10. The method of claim 1, wherein performing the ion implantation comprises implanting ions into the phase-shift regions of the substrate using an implantation energy in the range of about 35 keV to about 150 keV.

11. An alternating aperture phase-shift mask formed by the method of claim 1.

12. The method of claim 1, wherein damaging the phase-shift regions of the substrate is achieved by ion implanting selected materials into the phase-shift regions of the substrate at an implantation dose of greater than about $1\times10^{13}$ ions/cm$^2$.

13. The method of claim 12, wherein damaging the phase-shift regions of the substrate is achieved by ion implanting selected materials into the phase-shift regions of the substrate at an implantation dose in the range of about $1\times10^{13}$ ions/cm$^2$ to about $1\times10^{15}$ ions/cm$^2$.

14. The method of claim 1, wherein damaging the phase-shift regions of the substrate includes damaging portions of the substrate that lie underneath the opaque portions of the opaque pattern by ion implanting at an angle other than normal to the surface of the substrate, thereby extending damaged portions of the substrate underneath the opaque portions of the opaque pattern.

15. The method of claim 1, wherein performing ion implantation into the phase-shift regions of the substrate to damage the substrate comprises implanting ions into the substrate selected from the group of ions consisting of argon ions, neon ions, and xenon ions.

16. The method of claim 1, wherein performing ion implantation into the phase-shift regions of the substrate to damage the substrate comprises implanting oxygen ions into the substrate.

17. The method of claim 15, wherein the ion implantation is conducted at an implantation dose of greater than about $1\times10^{13}$ ions/cm$^2$.

18. The method of claim 16, wherein the ion implantation is conducted at an implantation dose of greater than about $1\times10^{13}$ ions/cm$^2$.

* * * * *